United States Patent
Lee et al.

(10) Patent No.: US 9,766,286 B2
(45) Date of Patent: Sep. 19, 2017

(54) DEFECT DIAGNOSIS

(71) Applicant: Taiwan Semiconductor Manufacturing Company Limited, Hsin-Chu (TW)

(72) Inventors: Kuen-Jong Lee, Tainan (TW); Cheng-Hung Wu, Keelung (TW); Wei-Cheng Lien, Taichung (TW); Hui-Ling Lin, HsinChu (TW); Yen-Ling Liu, Hsinchu (TW); Ji-Jan Chen, Kaohsiung (TW)

(73) Assignee: Taiwan Semiconductor Manufacturing Company Limited (TW)

( * ) Notice: Subject to any disclaimer, the term of this patent is extended or adjusted under 35 U.S.C. 154(b) by 263 days.

(21) Appl. No.: 14/463,911

(22) Filed: Aug. 20, 2014

(65) Prior Publication Data

US 2016/0055631 A1 Feb. 25, 2016

(51) Int. Cl.
*G06K 9/00* (2006.01)
*G01R 31/28* (2006.01)
*G01R 31/317* (2006.01)

(52) U.S. Cl.
CPC ..... *G01R 31/287* (2013.01); *G01R 31/31707* (2013.01)

(58) Field of Classification Search
None
See application file for complete search history.

(56) References Cited

U.S. PATENT DOCUMENTS

| 8,532,949 B2* | 9/2013 | Teh | G01N 21/9501 250/307 |
| 2012/0051621 A1* | 3/2012 | Ong | G03F 1/84 382/144 |
| 2014/0282334 A1* | 9/2014 | Hu | G01N 21/9501 716/112 |

* cited by examiner

*Primary Examiner* — Vikkram Bali
(74) *Attorney, Agent, or Firm* — Cooper Legal Group, LLC

(57) ABSTRACT

A method for diagnosing a defect is provided. A first candidate pair comprises a first defect candidate and a second defect candidate. A first pattern is generated to distinguish one or more faults of the first defect candidate from one or more faults of the second defect candidate. The first defect candidate is removed responsive to determining that the first pattern does not detect the first defect candidate and determining that an automatic test equipment (ATE) failure log associates the first pattern with failure. Removing the first candidate pair, as well as additional candidate pairs when possible, promotes diagnosis efficiency by reducing a number of computations required.

20 Claims, 7 Drawing Sheets

DEFECT DIAGNOSIS

BACKGROUND

At times an electronic device has one or more defects. Diagnosis is performed in an attempt to identify the location of at least one of the one or more defects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
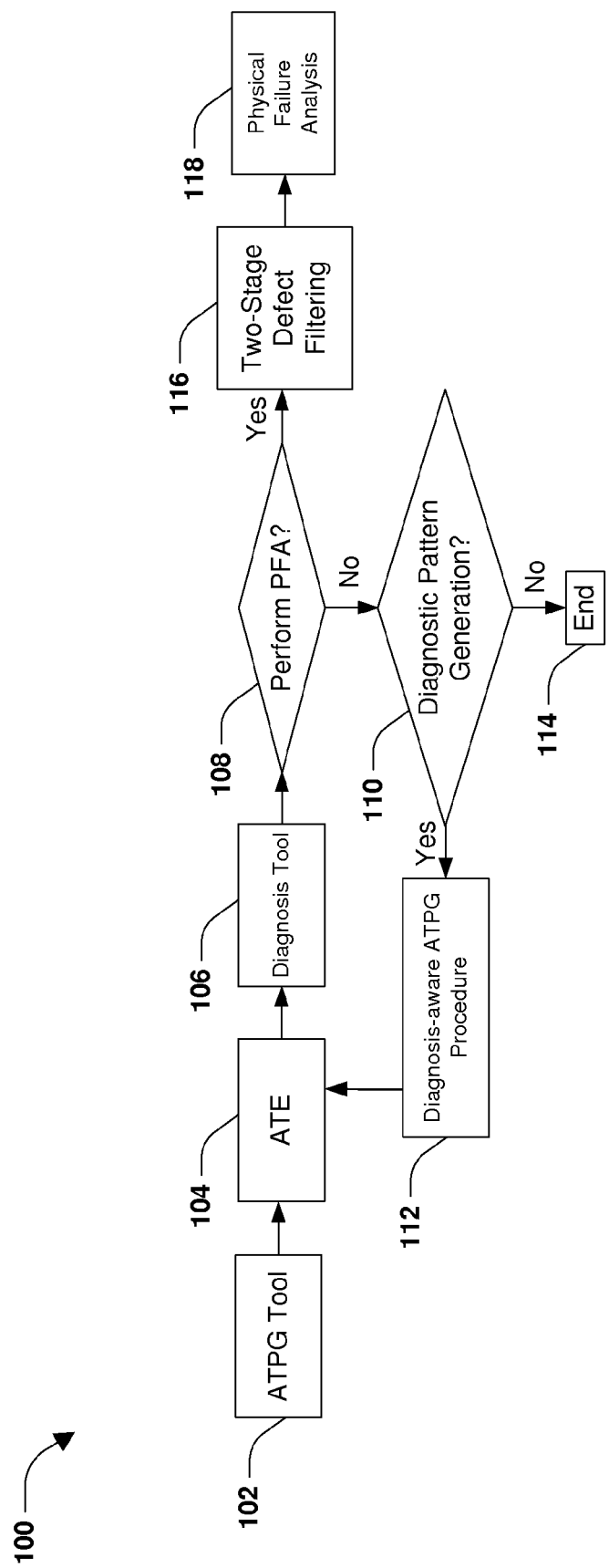
FIG. 1 is an illustration of a flow diagram of a method for defect identification, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, an electronic device is provided. In some embodiments, the electronic device has one or more defects. In some embodiments, diagnosis of at least one of the one or more defects is performed. In some embodiments, the diagnosis comprises identifying one or more sources of the defect. In some embodiments, performance of one or more methods, such as provided herein, increases efficiency of the diagnosis.

FIG. 1 illustrates a method 100 for defect identification. At 102, an automatic test pattern generation (ATPG) tool processes one or more faults to determine one or more testing patterns. At 104, automatic test equipment (ATE) is accessed to determine an ATE failure log. At 106, a diagnosis tool processes one or more faults, such as obtained from the ATE failure log, to determine a defect candidate list. At 108, a determination is made as to whether to perform physical failure analysis (PFA) based upon the candidate list. At 110, if a determination is made to not perform PFA, a determination is made as to whether to perform diagnostic pattern generation. At 112, if a determination is made to perform diagnostic pattern generation, a diagnosis-aware ATPG procedure is performed. At 114, if a determination is made to not perform diagnostic pattern generation, the method ends. At 116, if a determination is made to perform PFA, two-stage defect filtering is performed. At 118, PFA is performed.

Figure 2:
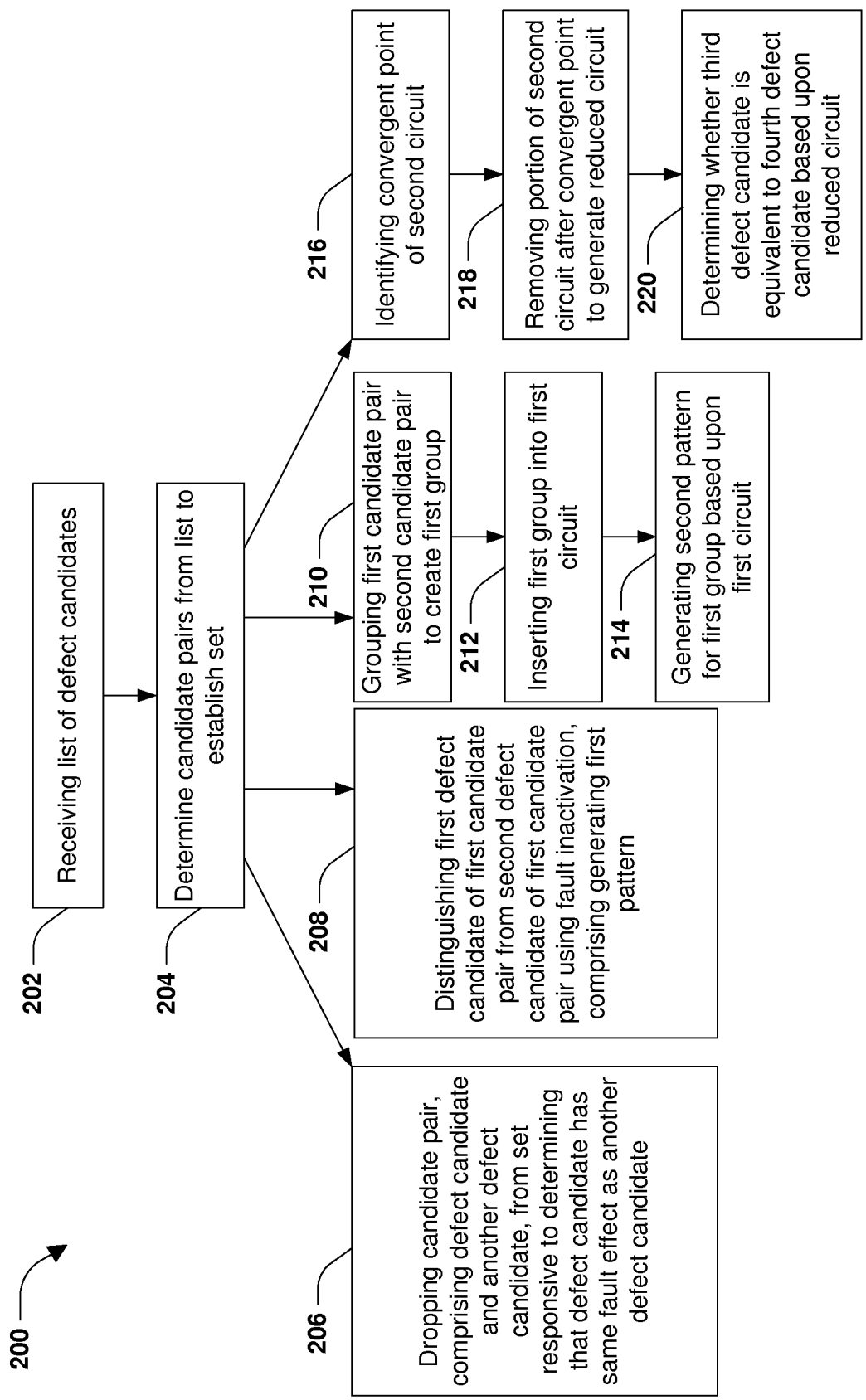
FIG. 2 is an illustration of a flow diagram of a method, in accordance with some embodiments.

FIG. 2 illustrates a method 200, such as corresponding to 112 in FIG. 1. At 202, a list of one or more defect candidates is received. At 204, one or more candidate pairs are determined from the list to establish a set of candidate pairs. At 206, a candidate pair is dropped from the set. In some embodiments, the candidate pair comprises a defect candidate and another candidate. In some embodiments, the candidate pair is dropped to generate a reduced set of candidate pairs. In some embodiments, the dropping is performed responsive to determining that the defect candidate has a same fault as the another defect candidate. In some embodiments, the dropping is performed responsive to determining that the defect candidate has a same fault effect as the another defect candidate. At 208, a first defect candidate of a first candidate pair in the reduced set is distinguished from a second defect candidate of the first candidate pair using fault inactivation. In some embodiments, fault inactivation comprises generating a first pattern that detects the first defect candidate but not the second defect candidate. In some embodiments, candidate pair grouping is performed. At 210, the first candidate pair is grouped with a second candidate pair in the reduced set to create a first group. In some embodiments, the grouping is performed responsive to determining that a first fan-out-cone of the first candidate pair does not overlap a second fan-out-cone of the second candidate pair. In some embodiments, the grouping is performed responsive to determining that a first portion of the first candidate pair does not overlap a second portion of the second candidate pair. In some embodiments, the grouping is performed responsive to determining that a first portion of a circuit that is associated with at least one of the first candidate pair or the second pair does not overlap a second portion of the circuit that is associated with at least one of the first candidate pair or the second pair. At 212, the first group is inserted into a first circuit. In some embodiments, two or more groups, comprising the first group, are inserted into the first circuit. At 214, a second pattern is generated for at least some of the first group based upon the first circuit. In some embodiments, the second pattern is generated for at least some of the first candidate pair. In some embodiments, the second pattern is generated for at least some of the second candidate pair. In some embodiments, sub-circuit analysis is performed. At 216, a convergent point of a second circuit is identified. In some embodiments, the convergent point is identified on a third fan-out-cone of a third defect candidate of a third candidate pair and a fourth fan-out-cone of a fourth defect candidate of the third candidate pair. In some embodiments, a fifth fan-out-cone of the convergent point is merely able to be affected by at least one of the third defect candidate or the fourth defect candidate via the convergent point. At 218, a portion of the second circuit is removed after the convergent point to generate a reduced circuit. In some embodiments, the portion of the second circuit is in a first direction of the convergent point. In some embodiments, the first direction is to the right of the convergent point. In some embodiments, the first direction is to the left of the convergent point. In some embodiments, the first direction is above the convergent point. In some embodiments, the first direction is below the convergent point. In some embodiments, the portion of the second portion is in a second direction of the convergent point, where the second direction is different than the first direction. In some embodiments, the second direction is to the right of the convergent point. In some embodiments, the second direction is to the left of the convergent point. In some embodiments, the second direction is above the convergent point. In some embodiments, the second direction is below the convergent point. At 220, a determination is made as to whether the third defect candidate is equivalent to the fourth defect candidate based upon the reduced circuit. In some embodiments, if the third defect candidate is determined to be equivalent to the fourth defect candidate, the third candidate pair is removed. In some embodiments, at least one of the dropping, the distinguishing, the candidate pair grouping or the sub-circuit analysis is performed to promote efficiency of defect diagnosis.

Figure 3:
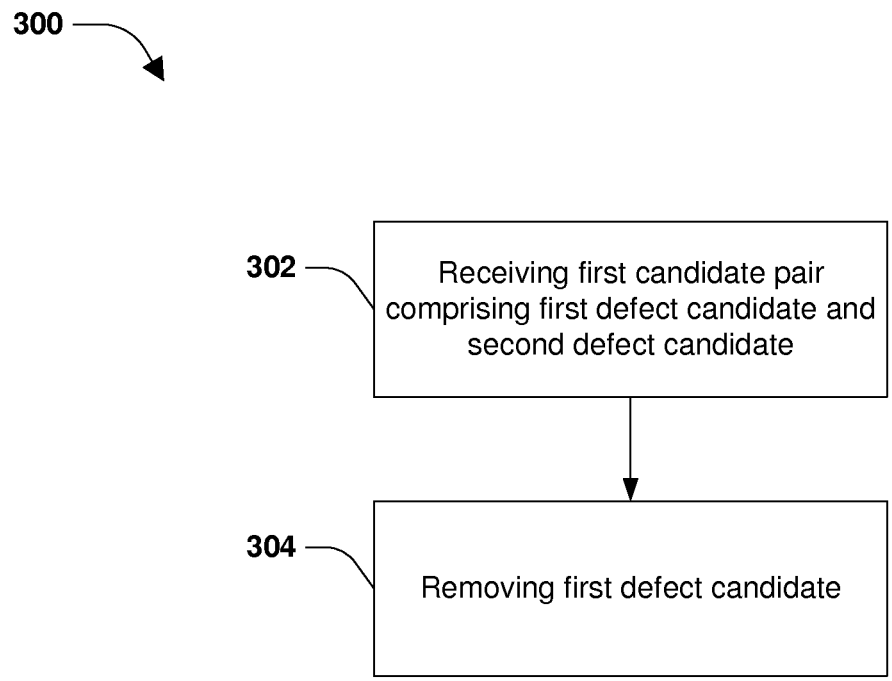
FIG. 3 is an illustration of a flow diagram of a method for a two stage defect filter, in accordance with some embodiments.

FIG. 3 illustrates a method 300 for two stage defect filtering, such as corresponding to 116 in FIG. 1. At 302, a first candidate pair is received. In some embodiments, the first candidate pair comprises a first defect candidate and a second defect candidate. At 304, the first defect candidate is removed. In some embodiments, the first defect candidate is removed responsive to determining that a first pattern does not detect the first defect candidate. In some embodiments, the first defect candidate is removed responsive to determining that an ATE failure log associates the first pattern with failure. In some embodiments, the determining that an ATE failure log associates the first pattern with failure comprising determining that the ATE failure log indicates that the first pattern is a failing pattern. In some embodiments, the first defect candidate is removed responsive to determining that the first pattern does not detect the first defect candidate and determining that the ATE failure log associates the first pattern with failure. In some embodiments, the second defect candidate is removed. In some embodiments, both the first defect candidate and the second defect candidate is removed. In some candidates, merely one of the first defect candidate or the second defect candidate is removed.

Figure 4:
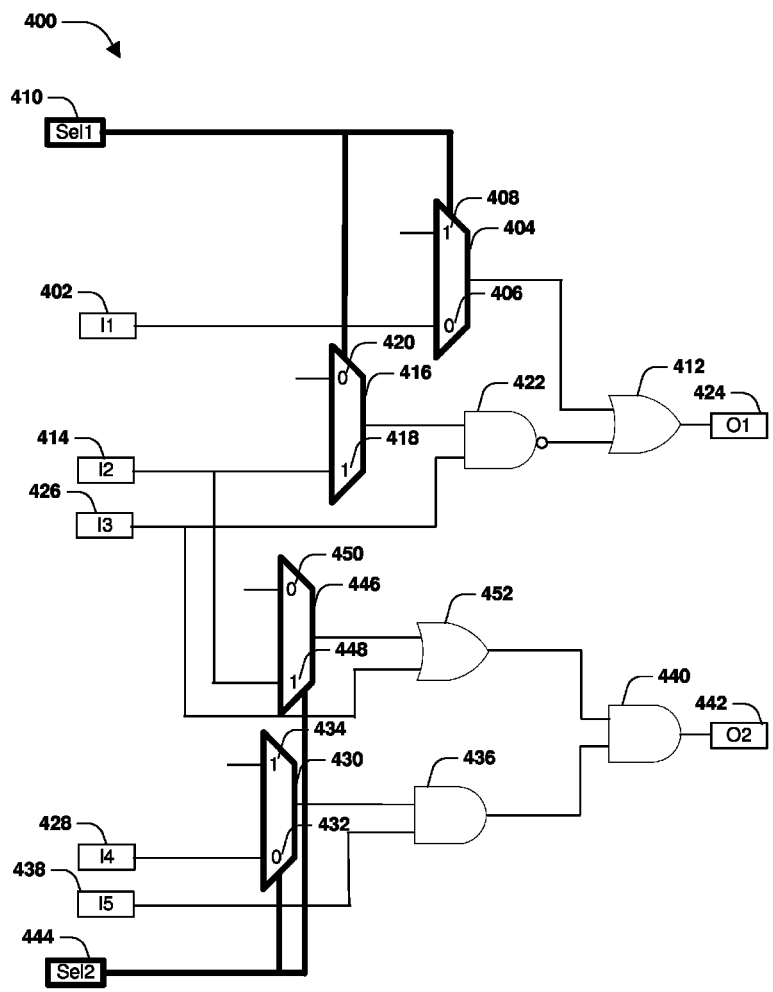
FIG. 4 is an illustration of a circuit implementing candidate pair grouping, in accordance with some embodiments.

FIG. 4 illustrates a circuit 400 implementing candidate pair grouping, such as corresponding to 210 in FIG. 2. In some embodiments, a first input 402 is connected to a first multiplexer 404. In some embodiments, the first input 402 is connected to a 0-input 406 of the first multiplexer 404. In some embodiments, the first multiplexer 404 comprises a 1-input 408. In some embodiments, the first multiplexer 404 is connected to a first sel line 410. In some embodiments, the first multiplexer 404 is connected to a first logic gate 412. In some embodiments, the first logic gate 412 comprises a first OR logic gate. In some embodiments, one or more gates illustrated in FIG. 4 are one or more types of gates. In some embodiments, a second input 414 is connected to a second multiplexer 416. In some embodiments, the second multiplexer 416 is connected to the first sel line 410. In some embodiments, the second input 414 is connected to a 1-input of the second multiplexer 416. In some embodiments, the second multiplexer 416 comprises a 0-input 420. In some embodiments, the second multiplexer 416 is connected to a second logic gate 422. In some embodiments, the second logic gate 422 comprises a first NAND logic gate. In some embodiments, the second logic gate 422 is connected to the first logic gate 412. In some embodiments, the first logic gate 412 is connected to a first output 424. In some embodiments, a third input 426 is connected to the second logic gate 422. In some embodiments, the second input 414 is connected to a third multiplexer 446. In some embodiments, the second input 414 is connected to a 1-input 448 of the third multiplexer 446. In some embodiments, the third multiplexer 446 comprises a 0-input 450. In some embodiments, the third multiplexer 446 is connected to third logic gate 452. In some embodiments, the third logic gate 452 comprises a second OR logic gate. In some embodiments, third input 426 is connected to the third logic gate 452. In some embodiments, the third logic gate 452 is connected to a fourth logic gate 440. In some embodiments, the fourth logic gate 440 comprises a first AND logic gate. In some embodiments, the fourth logic gate 440 is connected to a second output 442. In some embodiments, a fourth input 428 is connected to a fourth multiplexer 430. In some embodiments, the fourth input 428 is connected to a 0-input 432 of the fourth multiplexer 430. In some embodiments, the fourth multiplexer 430 comprises a 1-input 434. In some embodiments, the fourth multiplexer 430 is connected to a fifth logic gate 436. In some embodiments, the fifth logic gate 436 comprises a second AND logic gate. In some embodiments, a fifth input 438 is connected to the fifth logic gate 436. In some embodiments, the fifth logic gate 436 is connected to the fourth logic gate 440. In some embodiments, a second sel line 444 is connected to the third multiplexer 446 and the fourth multiplexer 430. In some embodiments, at least one of the first multiplexer 404, the second multiplexer 404 and the first sel line 410 represent at least a part of a first candidate pair. In some embodiments, at least one of the third multiplexer 446, the fourth multiplexer 430 or the second sel line 444 represent at least a part of a second candidate pair. In some embodiments, at least one of the first input 402, the second input 414, the third input 426, the fourth input 428 or the fifth input 438 at least one of comprise or are connected to an output of one or more other gates. In some embodiments, the first candidate pair and the second candidate pair are comprised in a first group. In some embodiments, more than two candidate pairs, comprising the first candidate pair and the second candidate pair, are comprised in the first group. In some embodiments, one or more portions of the first group are processed concurrently to promote efficiency of defect diagnosis. In some embodiments, the candidate pair grouping involves more than one group, comprising the first group.

Figure 5:
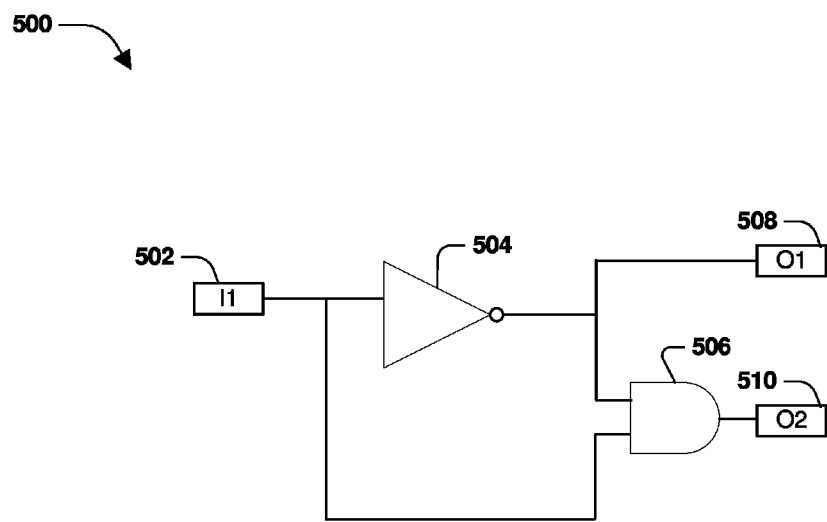
FIG. 5 is an illustration of a groups-switch cell, in accordance with some embodiments.

FIG. 5 illustrates a groups-switch cell 500. In some embodiments, a first input 502 is connected to a first inverter 504 and a first logic gate 506. In some embodiments, an output of the first inverter 504 is connected to a first output 508 and the first logic gate 506. In some embodiments, an output of the first logic gate 506 is connected to a second output 510. In some embodiments, when the first input 502 has a first value, the first output 508 and the second output 510 both have a same value. In some embodiments, the same value is the first value. In some embodiments, the first value is 1. In some embodiments, when the first input 502 has a second value different than the first value, the first output 508 has a different value than the second output 510. In some embodiments, when the first input 502 has a second value different than the first value, the first output 508 has the first value. In some embodiments, the second value is 0. In some embodiments, when the first input 502 has a second value different than the first value, the second output 510 has the second value.

In some embodiments, a plurality of candidate pairs are divided into two or more groups comprising a first group and a second group. In some embodiments, a fault effect associated with a first candidate in the first group in the two or more groups does not interfere with one or more other fault effects associated with one or more other candidates in the first group in the two or more groups. In some embodiments, the fault effect associated with the first candidate in the first group in the two or more groups is not the same as the one or more other fault effects associated with the one or more other candidates in the first group in the two or more groups. In some embodiments, a fault effect associated with a second candidate in the second group in the two or more groups does not interfere with one or more other fault effects associated with one or more other candidates in the second group in the two or more groups. In some embodiments, the fault effect associated with the second candidate in the second group in the two or more groups is not the same as the one or more other fault effects associated with the one or more other candidates in the second group in the two or more groups.

In some embodiments, the groups-switch cell 500 is used to insert one or more candidate pairs associated with one or more groups into a first circuit. In some embodiments, the groups-switch cell 500 is inserted before a first candidate pair in the first circuit. In some embodiments, the first output 508 is configured to control a first multiplexer associated with the candidate pair in the first circuit. In some embodiments, the second output 510 is configured to control a second multiplexer associated with the candidate pair in the first circuit. In some embodiments, one or more other instances of the groups-switch cell 500 are inserted before one or more other candidate pairs in the first circuit. In some embodiments, the one or more other candidate pairs are comprised in a same group as the first candidate pair. In some embodiments, a second instance of the groups-switch cell 500 is inserted before a second candidate pair in the first circuit. In some embodiments, the first output 508 of the second instance of the groups-switch cell 500 is configured to control a third multiplexer associated with the second candidate pair in the first circuit. In some embodiments, the second output 510 of the second instance of the groups-switch cell 500 is configured to control a fourth multiplexer associated with the second candidate pair in the first circuit. In some embodiments, the second candidate pair is comprised in the same group as the first candidate pair. In some embodiments, candidate pairs in the same group of candidate pairs are concurrently operated upon. In some embodiments, the concurrent operations are performed in association with a generation of one or more diagnosis patterns for one or more candidate pairs in the same group. In some embodiments, the first input 502 corresponding to the first candidate pair is set to a first value, while an instance of the first input 502 corresponding to the second candidate pair is set to a second value. In some embodiments, one or more other instances of the first input 502 corresponding to one or more other candidate pairs in the same group are set to the second value. In some embodiments, the first value is 1 and the second value is 0.

Figure 6:
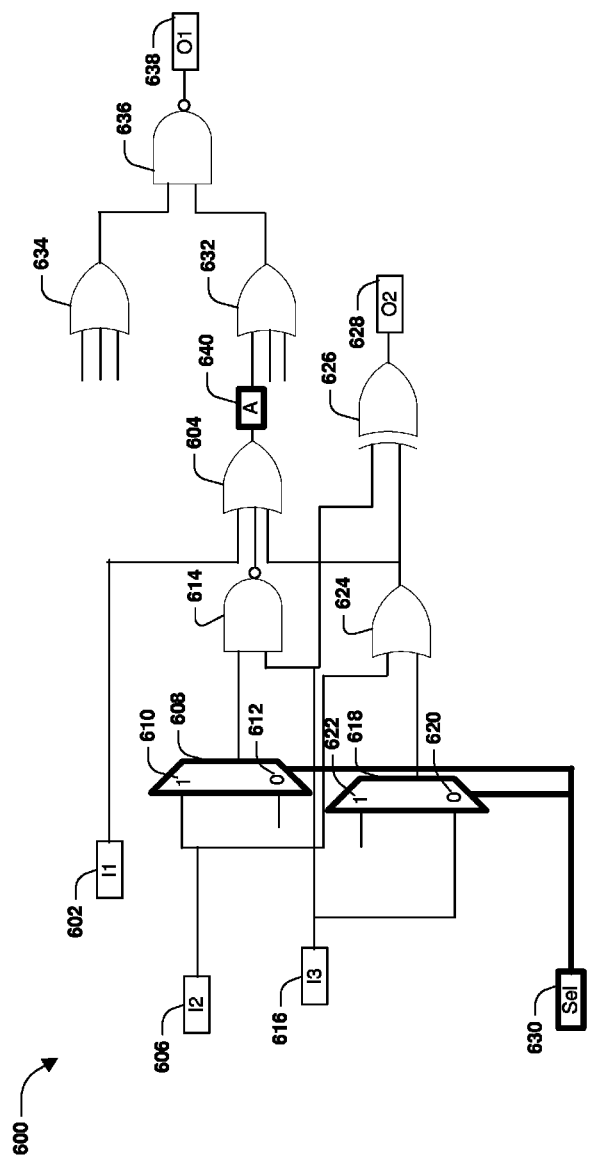
FIG. 6 is an illustration of a circuit implementing sub-circuit analysis, in accordance with some embodiments.

FIG. 6 illustrates a circuit 600 implementing sub-circuit analysis, such as corresponding to at least one of 216, 218 or 220 in FIG. 2. In some embodiments, a first input 602 is connected to a first logic gate 604. In some embodiments, the first logic gate 604 comprises a first OR logic gate. In some embodiments, one or more gates illustrated in FIG. 6 are one or more types of gates. In some embodiments, a second input 606 is connected to a first multiplexer 608. In some embodiments, the second input 606 is connected to a 1-input 610 of the first multiplexer 608. In some embodiments, the first multiplexer 608 comprises a 0-input 612. In some embodiments, the first multiplexer 608 is connected to a second logic gate 614. In some embodiments, the second logic gate 614 comprises a first NAND logic gate. In some embodiments, the second logic gate 614 is connected to the first logic gate 604. In some embodiments, a third input 616 is connected to the second logic gate 614. In some embodiments, the second input 606 is connected to a third logic gate 624. In some embodiments, the third logic gate 624 comprises a second OR logic gate. In some embodiments, at least one of the third input 616 or the third logic gate 624 is connected to a fourth logic gate 626. In some embodiments, the fourth logic gate 626 comprises a first XOR logic gate. In some embodiments, the fourth logic gate 626 is connected to a second output 628. In some embodiments, the third input 616 is connected to a second multiplexer 618. In some embodiments, the third input 616 is connected to a 0-input 620 of the second multiplexer 618. In some embodiments, the second multiplexer 618 comprises a 1-input 622. In some embodiments, the second multiplexer 618 is connected to the third logic gate 624. In some embodiments, the first multiplexer 608 and the second multiplexer 618 are connected to a selection line 630. In some embodiments, the first logic gate 604 is connected to a fifth logic gate 632. In some embodiments, the fifth logic gate 632 is connected to a sixth logic gate 636. In some embodiments, the sixth logic gate 636 comprises a second NAND logic gate. In some embodiments, a seventh logic gate 634 is connected to the sixth logic gate 636. In some embodiments, the sixth logic gate 636 is connected to a first output 638. In some embodiments, Point A 640 is identified as a convergent point of the circuit 600. In some embodiments, a portion of the circuit 600 after the convergent point is removed from the circuit 600 to generate a reduced circuit. In some embodiments, at least fifth logic gate 632, sixth logic gate 636 and seventh logic gate 634 are removed from the circuit 600 to generate the reduced circuit to promote efficiency of defect diagnosis.

Figure 7:
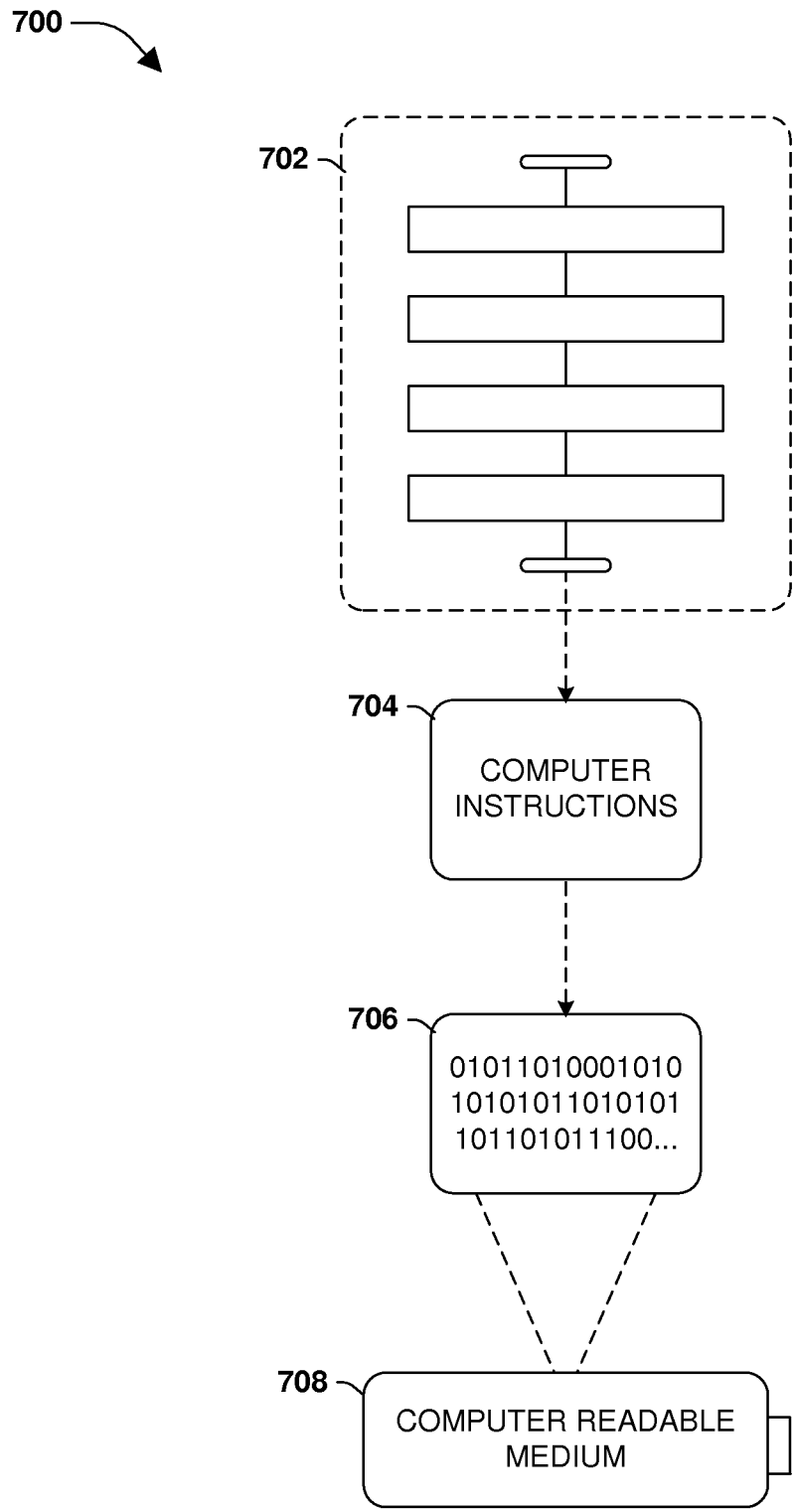
FIG. 7 is an illustration of an example computer-readable medium and/or computer-readable device comprising processor-executable instructions configured to embody one or more of the provisions set forth herein, according to various embodiments.

Still another embodiment involves a computer-readable medium comprising processor-executable instructions configured to implement one or more of the techniques presented herein. An example embodiment of a computer-readable medium and/or a computer-readable device that is devised in these ways is illustrated in FIG. 7, wherein the implementation 700 comprises a computer-readable medium 708, such as a CD-R, DVD-R, flash drive, a platter of a hard disk drive, etc., on which is encoded computer-readable data 706. This computer-readable data 706 in turn comprises a set of computer instructions 704 configured to operate according to one or more of the principles set forth herein. In one such embodiment 700, the processor-executable computer instructions 704 is configured to perform a method 702, such as at least some of the exemplary method 100 of FIG. 1, at least some of exemplary method 200 of FIG. 2 and/or at least some of exemplary method 300 of FIG. 3, for example. Many such computer-readable media are devised by those of ordinary skill in the art that are configured to operate in accordance with the techniques presented herein.

In some embodiments, a method is provided. In some embodiments, the method comprises receiving a first candidate pair comprising a first defect candidate and a second defect candidate. In some embodiments, the method comprises removing the first defect candidate responsive to determining that a first pattern does not detect the first defect candidate and determining that an automatic test equipment (ATE) failure log associates the first pattern with failure.

In some embodiments, a method is provided. In some embodiments, the method comprises receiving a list of one or more defect candidates. In some embodiments, the method comprises determining one or more candidate pairs from the list to establish a set of candidate pairs. In some embodiments, the method comprises dropping a candidate pair, comprising a defect candidate and another defect candidate, from the set to generate a reduced set of candidate pairs responsive to determining that the defect candidate has a same fault as the another defect candidate. In some embodiments, the method comprises distinguishing a first defect candidate of a first candidate pair in the reduced set from a second defect candidate of the first candidate pair using fault inactivation, comprising generating a first pattern that detects the first defect candidate but not the second defect candidate. In some embodiments, the method comprises performing candidate pair grouping. In some embodiments, the candidate pair grouping comprises grouping the first candidate pair with a second candidate pair in the reduced set to create a first group responsive to determining that a first fan-out-cone of the first candidate pair does not overlap a second fan-out-cone of the second candidate pair. In some embodiments, the candidate pair grouping comprises inserting the first group into a first circuit. In some embodiments, the candidate pair grouping comprises generating a second pattern for at least some of the first group based upon the first circuit. In some embodiments, the method comprise performing sub-circuit analysis. In some embodiments, the sub-circuit analysis comprises identifying a convergent point of a second circuit on a third fan-out-cone of a third defect candidate of a third candidate pair and a fourth fan-out-cone of a fourth defect candidate of the third candidate pair, where a fifth fan-out-cone of the convergent point is merely able to be affected by at least one of the third defect candidate or the fourth defect candidate via the convergent point. In some embodiments, the sub-circuit analysis comprises removing a portion of the second circuit after the convergent point to generate a reduced circuit. In some embodiments, the sub-circuit analysis comprises determining whether the third defect candidate is equivalent to the fourth defect candidate based upon the reduced circuit.

In some embodiments, a method is provided. In some embodiments, the method comprises receiving a list of one or more defect candidates. In some embodiments, the method comprises determining one or more candidate pairs from the list to establish a set of candidate pairs. In some embodiments, the method comprises dropping a candidate pair, comprising a defect candidate and another defect candidate, from the set to generate a reduced set of candidate pairs responsive to determining that the defect candidate has a same fault as the another defect candidate. In some embodiments, the method comprises distinguishing a first defect candidate of a first candidate pair in the reduced set from a second defect candidate of the first candidate pair using fault inactivation, comprising generating a first pattern that detects the first defect candidate but not the second defect candidate. In some embodiments, the method comprises grouping the first candidate pair with a second candidate pair in the reduced set to create a first group responsive to determining that a first fan-out-cone of the first candidate pair does not overlap a second fan-out-cone of the second candidate pair. In some embodiments, the method comprises inserting the first group into a first circuit. In some embodiments, the method comprises generating a second pattern for at least some of the first group based upon the first circuit. In some embodiments, the method comprises identifying a convergent point of a second circuit on a third fan-out-cone of a third defect candidate of a third candidate pair and a fourth fan-out-cone of a fourth defect candidate of the third candidate pair, where a fifth fan-out-cone of the convergent point is merely able to be affected by at least one of the third defect candidate or the fourth defect candidate via the convergent point. In some embodiments, the method comprises removing a portion of the second circuit after the convergent point to generate a reduced circuit. In some embodiments, the method comprises determining whether the third defect candidate is equivalent to the fourth defect candidate based upon the reduced circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method, comprising:
    receiving a list of one or more defect candidates;
    determining a plurality of candidate pairs from the list to establish a set of candidate pairs, wherein the determining comprises:
        generating a first candidate pair comprising a first defect candidate and a second defect candidate responsive to determining that the first defect candidate and the second defect candidate have a same defect; and
        generating a second candidate pair comprising a third defect candidate and a fourth defect candidate responsive to determining that the third defect candidate and the fourth defect candidate have a same fault effect; and
    at least one of:
        dropping the second candidate pair from the set of candidate pairs to generate a reduced set of candidate pairs responsive to determining that the third defect candidate and the fourth defect candidate have the same fault effect;
        performing candidate pair grouping, comprising:
            distinguishing a fifth defect candidate of a third candidate pair in the reduced set of candidate pairs from a sixth defect candidate of the third candidate pair using fault inactivation, wherein the fault inactivation comprises forming a first pattern that detects the fifth defect candidate but not the sixth defect candidate;
            grouping the third candidate pair with a fourth candidate pair in the reduced set of candidate pairs to create a first group responsive to determining that a first portion of a first circuit associated with the third candidate pair does not overlap a second portion of the first circuit associated with the fourth candidate pair;
            inserting the first group into a second circuit; and
            forming a second pattern for at least some of the first group based upon the second circuit; or
        performing sub-circuit analysis, comprising:
            identifying a convergent point of a third circuit on a first portion of the third circuit that is associated with a seventh defect candidate of a fifth candidate pair and a second portion of the third circuit that is associated with an eighth defect candidate of the fifth candidate pair, wherein a third portion of the third circuit that is associated with the convergent point is merely able to be affected by at least one of the seventh defect candidate or the eighth defect candidate via the convergent point;
            removing at least some of the third circuit after the convergent point to generate a reduced circuit; and
            determining whether the seventh defect candidate is equivalent to the eighth defect candidate based upon the reduced circuit.

2. The method of claim 1, wherein the second circuit and the third circuit are a same circuit.

3. The method of claim 1, wherein the second circuit is different than the third circuit.

4. The method of claim 1, wherein at least one of the third candidate pair or the fourth candidate pair is a same candidate pair as the fifth candidate pair.

5. The method of claim 1, wherein at least one of the third candidate pair or the fourth candidate pair is different than the fifth candidate pair.

6. The method of claim 1, wherein the first pattern and the second pattern are a same pattern.

7. The method of claim 1, wherein the first pattern is different than the second pattern.

8. A method, comprising:
    receiving a list of one or more defect candidates;
    determining a plurality of candidate pairs from the list to establish a set of candidate pairs, wherein the determining comprises:
        generating a first candidate pair comprising a first defect candidate and a second defect candidate responsive to determining that the first defect candidate and the second defect candidate have a same defect; and
        generating a second candidate pair comprising a third defect candidate and a fourth defect candidate responsive to determining that the third defect candidate and the fourth defect candidate have a same fault effect;
    dropping the second candidate pair from the set of candidate pairs to generate a reduced set of candidate pairs responsive to determining that the third defect candidate and the fourth defect candidate have the same fault effect;
    distinguishing a fifth defect candidate of a third candidate pair in the reduced set of candidate pairs from a sixth defect candidate of the third candidate pair using fault inactivation, wherein the fault inactivation comprises forming a first pattern that detects the fifth defect candidate but not the sixth defect candidate;
    grouping the third candidate pair with a fourth candidate pair in the reduced set of candidate pairs to create a first group responsive to determining that a first portion of a first circuit associated with the third candidate pair does not overlap a second portion of the first circuit associated with the fourth candidate pair;
    inserting the first group into a second circuit;
    forming a second pattern for at least some of the first group based upon the second circuit;
    identifying a convergent point of a third circuit on a first portion of the third circuit that is associated with a seventh defect candidate of a fifth candidate pair and a second portion of the third circuit that is associated with an eighth defect candidate of the fifth candidate pair, wherein a third portion of the third circuit that is associated with the convergent point is merely able to be affected by at least one of the seventh defect candidate or the eighth defect candidate via the convergent point;

removing at least some of the third circuit after the convergent point to generate a reduced circuit; and determining whether the seventh defect candidate is equivalent to the eighth defect candidate based upon the reduced circuit.

9. The method of claim 8, wherein the second circuit and the third circuit are a same circuit.

10. The method of claim 8, wherein the second circuit is different than the third circuit.

11. The method of claim 8, wherein at least one of the third candidate pair or the fourth candidate pair is a same candidate pair as the fifth candidate pair.

12. The method of claim 8, wherein at least one of the third candidate pair or the fourth candidate pair is different than the fifth candidate pair.

13. The method of claim 8, wherein the first pattern and the second pattern are a same pattern.

14. The method of claim 8, wherein the first pattern is different than the second pattern.

15. A method, comprising:

receiving a list of one or more defect candidates;

determining a plurality of candidate pairs from the list to establish a set of candidate pairs, wherein the determining comprises:

generating a first candidate pair comprising a first defect candidate and a second defect candidate responsive to determining that the first defect candidate and the second defect candidate have a same defect; and generating a second candidate pair comprising a third defect candidate and a fourth defect candidate responsive to determining that the third defect candidate and the fourth defect candidate have a same fault effect;

grouping a third candidate pair of the plurality of candidate pairs with a fourth candidate pair of the plurality of candidate pairs to create a first group responsive to determining that a first portion of a first circuit associated with the third candidate pair does not overlap a second portion of the first circuit associated with the fourth candidate pair;

inserting the first group into a second circuit; and forming a first pattern for at least some of the first group based upon the second circuit.

16. The method of claim 15, comprising:

identifying a convergent point of the second circuit on a first portion of the second circuit that is associated with a fifth defect candidate of the third candidate pair and a second portion of the second circuit that is associated with a sixth defect candidate of the third candidate pair;

removing at least some of the second circuit after the convergent point to generate a reduced circuit; and determining whether the fifth defect candidate is equivalent to the sixth defect candidate based upon the reduced circuit.

17. The method of claim 15, comprising:

dropping the second candidate pair from the set of candidate pairs to generate a reduced set of candidate pairs responsive to determining that the third defect candidate and the fourth defect candidate have the same fault effect.

18. The method of claim 17, wherein the third candidate pair and the fourth candidate pair are selected from the reduced set of candidate pairs.

19. The method of claim 15, comprising:

distinguishing a fifth defect candidate of the third candidate pair from a sixth defect candidate of the third candidate pair using fault inactivation prior to the grouping, wherein the distinguishing comprises forming a second pattern that detects the fifth defect candidate but not the sixth defect candidate.

20. The method of claim 19, wherein the first pattern is different than the second pattern.

\* \* \* \* \*